United States Patent
Huang

(10) Patent No.: US 12,543,586 B2
(45) Date of Patent: Feb. 3, 2026

(54) SEMICONDUCTOR PACKAGE AND METHOD OF MANUFACTURING THE SAME

(71) Applicant: NANYA TECHNOLOGY CORPORATION, New Taipei (TW)

(72) Inventor: Hsin-Mao Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 373 days.

(21) Appl. No.: 18/229,526

(22) Filed: Aug. 2, 2023

(65) Prior Publication Data
US 2025/0046661 A1    Feb. 6, 2025

(51) Int. Cl.
H01L 23/13    (2006.01)
H01L 23/00    (2006.01)
H01L 23/31    (2006.01)
H01L 23/498    (2006.01)

(52) U.S. Cl.
CPC .......... *H01L 23/13* (2013.01); *H01L 23/3128* (2013.01); *H01L 23/49816* (2013.01); *H01L 23/49838* (2013.01); *H01L 24/13* (2013.01); *H01L 24/16* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2924/14361* (2013.01)

(58) Field of Classification Search
CPC .............. H01L 23/13; H01L 23/49838; H01L 23/3121; H01L 23/3128; H01L 2224/16221–1624
See application file for complete search history.

(56) References Cited

U.S. PATENT DOCUMENTS

| | | | | |
|---|---|---|---|---|
| 5,777,391 A | * | 7/1998 | Nakamura | H01L 24/05 257/784 |
| 7,633,160 B1 | * | 12/2009 | Lee | H01L 23/49816 257/E23.141 |
| 2004/0164389 A1 | * | 8/2004 | Lee | H01L 23/13 257/E21.511 |

(Continued)

FOREIGN PATENT DOCUMENTS

| TW | 200939423 A | 9/2009 |
|---|---|---|
| TW | 201017843 A | 5/2010 |
| TW | 201528389 A | 7/2015 |

*Primary Examiner* — Yu Chen
(74) *Attorney, Agent, or Firm* — CKC & Partners Co., LLC

(57) ABSTRACT

A semiconductor package includes a package substrate, a semiconductor chip, a plurality of conductive bumps and a molding compound. The package substrate has a first surface, a second surface opposite to the first surface, and at least one slot extending from the first surface to the second surface. The semiconductor chip is disposed on the package substrate and includes a chip circuit facing the slot of the package substrate. The conductive bumps are located between the package substrate and the semiconductor chip. The conductive bumps electrically connect the semiconductor chip to the package substrate. The molding compound encapsulates the semiconductor chip and the conductive bumps.

14 Claims, 3 Drawing Sheets

(56) References Cited

U.S. PATENT DOCUMENTS

| | | | | |
|---|---|---|---|---|
| 2008/0054494 | A1* | 3/2008 | Chen | H01L 24/06 |
| | | | | 257/787 |
| 2009/0134504 | A1* | 5/2009 | Lee | H01L 23/13 |
| | | | | 257/680 |
| 2015/0364344 | A1* | 12/2015 | Yu | H01L 21/561 |
| | | | | 257/713 |
| 2017/0133353 | A1* | 5/2017 | Lin | H01L 24/49 |
| 2019/0148330 | A1* | 5/2019 | Chen | H01L 23/5384 |
| | | | | 257/774 |
| 2019/0157197 | A1* | 5/2019 | Fang | H01L 24/85 |
| 2021/0028150 | A1* | 1/2021 | Yen | H01L 23/5386 |
| 2021/0272929 | A1* | 9/2021 | Tsai | H01L 23/5383 |
| 2023/0109136 | A1* | 4/2023 | Yang | H01L 24/48 |
| | | | | 257/668 |

\* cited by examiner

SEMICONDUCTOR PACKAGE AND METHOD OF MANUFACTURING THE SAME

BACKGROUND

Technical Field

The present disclosure relates to a semiconductor package and a method of manufacturing the semiconductor package.

Description of Related Art

Design-of-Experiments (DOE) is a widely adopted approach in the design and fabrication of semiconductor packages. To facilitate DOE, semiconductor packages should be designed in a way that enables easy internal probing.

SUMMARY

An aspect of the disclosure is to provide a semiconductor package that allows easy internal probing and a method of manufacturing the semiconductor package.

In accordance with an embodiment of the present disclosure, a semiconductor package includes a package substrate, a semiconductor chip, a plurality of conductive bumps and a molding compound. The package substrate has a first surface, a second surface opposite to the first surface, and at least one slot extending from the first surface to the second surface. The semiconductor chip is disposed on the package substrate and includes a chip circuit facing the slot of the package substrate. The conductive bumps are located between the package substrate and the semiconductor chip. The conductive bumps electrically connect the semiconductor chip to the package substrate. The molding compound encapsulates the semiconductor chip and the conductive bumps.

In one or more embodiments of the present disclosure, an orthogonal projection of the slot projected onto the semiconductor chip at least partially overlaps with the chip circuit.

In one or more embodiments of the present disclosure, the semiconductor chip has a central portion. The chip circuit is located in the central portion. The semiconductor chip further includes a plurality of bonding pads arranged around the central portion and connected to the conductive bumps.

In one or more embodiments of the present disclosure, the package substrate has a central portion. The slot is located in the central portion, the package substrate includes a plurality of first conductive pads arranged around the central portion and connected to the conductive bumps.

In one or more embodiments of the present disclosure, the package substrate further includes a plurality of second conductive pads and a plurality of conductive routes. The first conductive pads are located on the first surface, and the second conductive pads are located on the second surface. The conductive routes electrically connect the first conductive pads to the second conductive pads. The second conductive pads and the conductive routes are arranged around the central portion.

In one or more embodiments of the present disclosure, the semiconductor package further includes a plurality of external connection terminals. The external connection terminals are attached to the second surface of the package substrate which is away from the semiconductor chip. The package substrate has a central portion. The slot is located in the central portion. The external connection terminals are arranged around the central portion.

In one or more embodiments of the present disclosure, the chip circuit includes an inspection circuit.

In one or more embodiments of the present disclosure, the chip circuit includes a data signal circuit.

In one or more embodiments of the present disclosure, the semiconductor chip has a first width. The slot has a second width greater than the first width.

In one or more embodiments of the present disclosure, the slot is partially located outside an orthogonal projection of the semiconductor chip projected onto the package substrate.

In one or more embodiments of the present disclosure, the slot is filled by the molding compound.

In accordance with an embodiment of the present disclosure, a method of manufacturing a semiconductor package includes: providing a package substrate, the package substrate having a first surface, a second surface opposite to the first surface, and at least one slot extending from the first surface to the second surface; mounting a semiconductor chip on the package substrate by a flip-chip bonding process, such that a chip circuit of the semiconductor chip faces the slot; and encapsulating the semiconductor chip with a molding compound.

In sum, in the semiconductor package of the present disclosure, the package substrate is provided with a slot, and the semiconductor chip mounted on the package substrate is provided with a chip circuit that faces the slot. By this arrangement, the chip circuit of the semiconductor chip can be accessed through the slot of the package substrate. The chip circuit may include an inspection circuit, such that probing of the semiconductor chip can be performed through the slot of the package substrate. The chip circuit may include a data signal circuit, and the data signal circuit can be edited or repaired through the slot of the package substrate.

It is to be understood that both the foregoing general description and the following detailed description are by examples, and are intended to provide further explanation of the disclosure as claimed.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1:
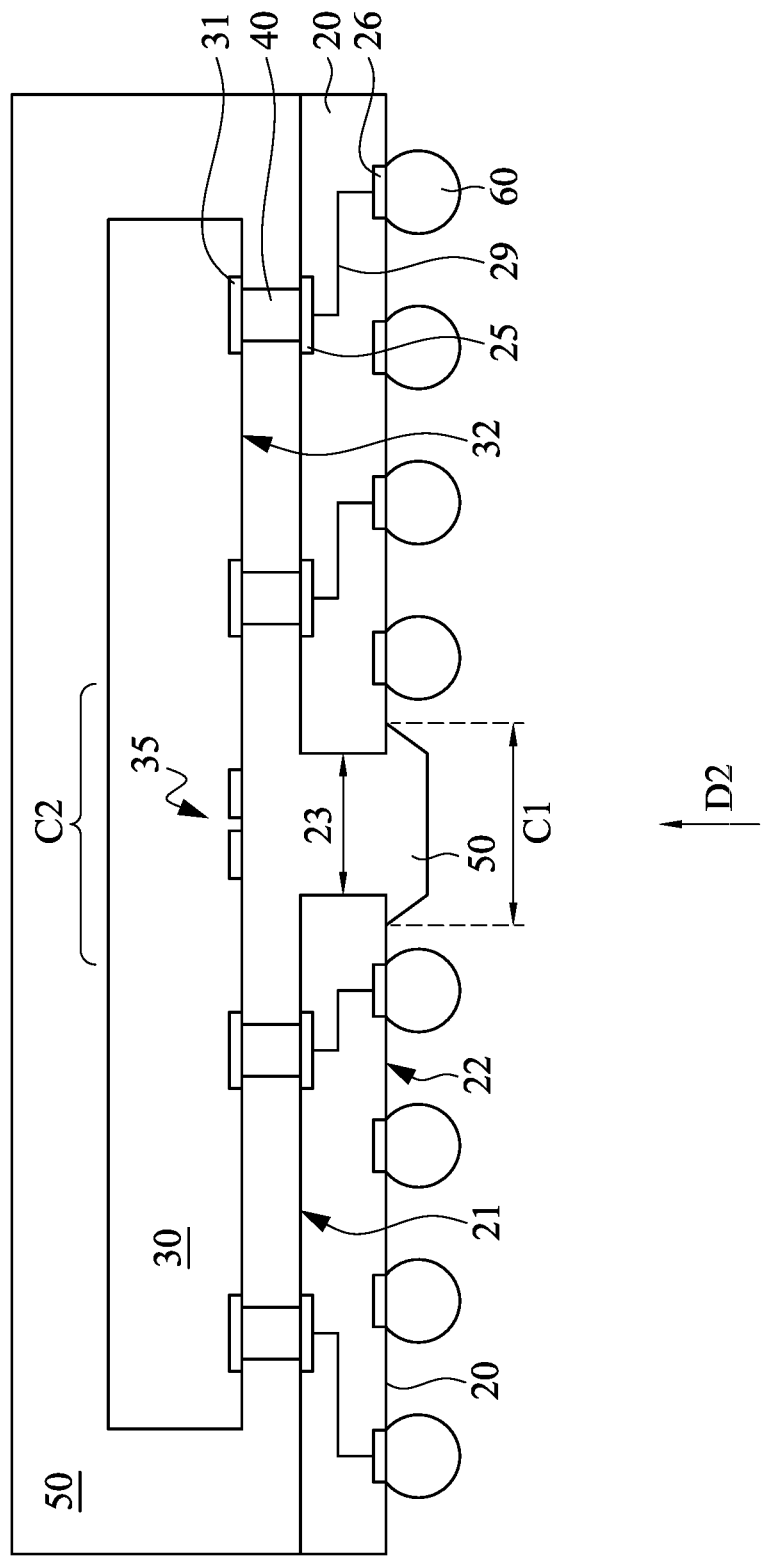
FIG. 1 illustrates a schematic cross-sectional view of a semiconductor package in accordance with an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Figure 2:
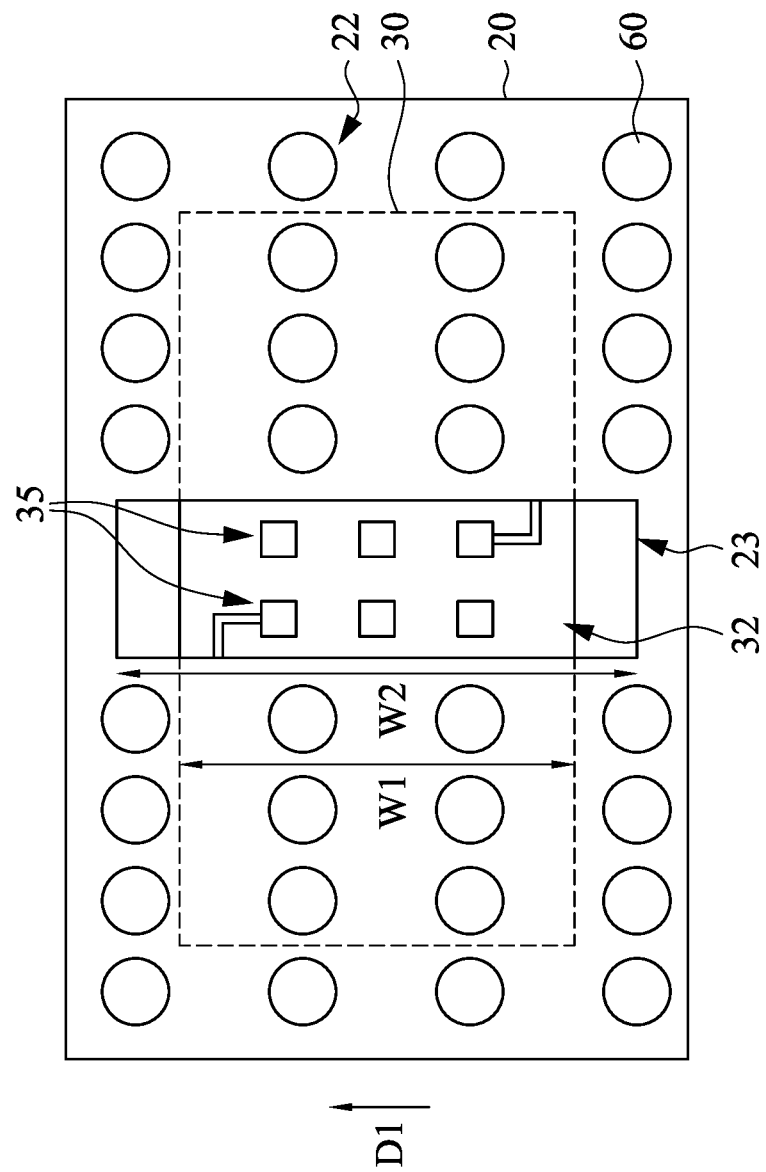
FIG. 2 illustrates a schematic bottom view of the semiconductor package shown in FIG. 1.

Reference is made to FIGS. 1 and 2. FIG. 1 illustrates a schematic cross-sectional view of a semiconductor package 10 in accordance with an embodiment of the present disclosure, and FIG. 2 illustrates a schematic bottom view of the semiconductor package 10 shown in FIG. 1. As shown in FIGS. 1 and 2, the semiconductor package 10 includes a package substrate 20 and a semiconductor chip 30 disposed on the package substrate 20. Specifically, the semiconductor chip 30 is mounted on the package substrate 20 by a flip-chip bonding process. The semiconductor chip 30 is in a face-down configuration. In other words, the semiconductor chip 30 includes a plurality of bonding pads 31, and the bonding pads 31 are provided on a lower surface 32 of the semiconductor chip 30 and are electrically coupled to the package substrate 20.

As shown in FIGS. 1 and 2, the semiconductor package 10 further includes a plurality of conductive bumps 40 located between the package substrate 20 and the semiconductor chip 30 and electrically connect the semiconductor chip 30 to the package substrate 20. The conductive bumps 40 can provide signal connections and power connections between the semiconductor chip 30 and the package substrate 20. The conductive bumps 40 may be attached to the bonding pads 31.

In some embodiments, the semiconductor package 10 is a memory package, such as a DDR5 SDRAM package, and the semiconductor chip 30 is a DRAM die. In some embodiments, the package substrate 20 is a circuit board with wiring patterns thereon. In some embodiments, the conductive bumps 40 may include tin (Sn), lead (Pb), nickel (Ni), gold (Au), silver (Ag), copper (Cu), bismuth (Bi), other suitable conductive materials, or any combination thereof. In some embodiments, the conductive bumps 40 may include copper pillars or solder balls.

In some embodiments, the semiconductor package 10 is a flip-chip package, and the semiconductor chip 30 is electrically connected to the package substrate 20 only through the conductive bumps 40 (i.e., there is no bonding wire connecting the semiconductor chip 30 to the package substrate 20). In addition, although FIG. 1 shows a configuration in which the semiconductor package 10 includes a single semiconductor chip, it should be noted that in other configurations, the semiconductor package 10 may include more than one semiconductor chips. For example, one or more additional semiconductor chips may be stacked on the semiconductor chip 30 and connected to the semiconductor chip 30 or the package substrate 20 via structures such as conductive bumps, through-silicon vias (TSV) or bonding wires.

As shown in FIGS. 1 and 2, the semiconductor package 10 further includes a molding compound 50 encapsulating the semiconductor chip 30 and the conductive bumps 40. In other words, the semiconductor chip 30 and the conductive bumps 40 are embedded in the molding compound 50. In some embodiments, the molding compound 50 may cover an upper surface of the package substrate 20, laterals surface of the semiconductor chip 30, and an upper surface of the semiconductor chip 30. The molding compound 50 may also fill the gap between semiconductor chip 30 and the package substrate 20. In some embodiments, the molding compound 50 may include epoxy resin, polyimide (PI), other suitable materials, or any combination thereof.

As shown in FIGS. 1 and 2, in some embodiments, the semiconductor package 10 further includes a plurality of external connection terminals 60 provide on the package substrate 20. Specifically, the package substrate 20 has a first surface 21 and a second surface 22. The semiconductor chip 30 is disposed on the first surface 21 of the package substrate 20. The second surface 22 of the package substrate 20 is opposite to the first surface 21, and thus the second surface 22 is farther away from the semiconductor chip 30 than the first surface 21. The external connection terminals 60 are disposed on the second surface 22 of the package substrate 20, and the external connection terminals 60 are electrically coupled to the semiconductor chip 30 through the wiring patterns of the package substrate 20 and the conductive bumps 40.

The external connection terminals 60 serve as the external connection interface of the semiconductor package 10. For example, the external connection terminals 60 may include solder balls that can be connected to an electronic component (such as a printed circuit board) to enable signal transmission and power transmission between semiconductor package 10 and the electronic component. The external connection terminals 60 may be in the form of a ball grid array (BGA), which can be soldered to an electronic component such as a printed circuit board. Alternatively, the external connection terminals 60 may form a fine ball grid array (FBGA) or a land grid array (LGA). In some embodiments, the external connection terminals 60 may include tin (Sn), lead (Pb), nickel (Ni), gold (Au), silver (Ag), copper (Cu), bismuth (Bi), other suitable conductive materials, or any combination thereof.

As shown in FIGS. 1 and 2, the package substrate 20 has at least one slot 23 extending from the first surface 21 of the package substrate 20 to the second surface 22 of the package substrate 20 (in other words, the slot 23 penetrates through the package substrate 20). The semiconductor chip 30 includes a chip circuit 35. The chip circuit 35 is located on the lower surface 32 of the semiconductor chip 30 and faces the slot 23 of the package substrate 20. By this arrangement, the chip circuit 35 of the semiconductor chip 30 is exposed through the slot 23 of the package substrate 20, and various tasks can be performed through the slot 23 of the package substrate 20, such as measuring the signals of the semiconductor chip 30, repairing the circuits of the semiconductor chip 30, or editing the circuits of the semiconductor chip 30.

In some embodiments, the chip circuit 35 of the semiconductor chip 30 includes an inspection circuit, through which signal measurements of the semiconductor chip 30 can be carried out to facilitate the DOE design approach of semiconductor package. In some embodiments, the chip circuit 35 of the semiconductor chip 30 includes a data signal circuit. When an issue of the semiconductor chip 30 is identified, the data signal circuit can be edited or repaired through the slot 23 of the package substrate 20. In some embodiments, other type of circuit can be arranged to face the slot 23 of the package substrate 20, such as a power supply circuit.

In some embodiments, probing or circuit editing of the semiconductor chip 30 can be carried out by means of focused ion beam (FIB) technique. The FIB technique can perform etching or deposition at a target spot. For example, the FIB technique can be used to cut unwanted electrical connections in the semiconductor chip 30. For example, the FIB technique can be used to deposit conductive materials to create an electrical connection in the semiconductor chip 30.

As shown in FIGS. 1 and 2, in some embodiments, an orthogonal projection of the slot 23 projected onto the lower surface 32 of the semiconductor chip 30 at least partially overlaps with the chip circuit 35. In other words, the chip circuit 35 is partially or completely located in the orthogonal projection of the slot 23 projected onto the lower surface 32 of the semiconductor chip 30, such that the chip circuit 35 can be conveniently accessed through the slot 23 of the package substrate 20. In some embodiments, the chip circuit 35 includes at least one of an inspection circuit and a data signal circuit. In some embodiments, the inspection circuit and the data signal circuit may include conductive structures such as conductive pads and conductive traces.

In some embodiments, the molding compound 50 is created by injecting a resin material through the slot 23 of the package substrate 20 from a lower side of the package substrate 20 (i.e., the side of the package substrate 20 away from the semiconductor chip 30).

As shown in FIGS. 1 and 2, in some embodiments, the semiconductor chip 30 has a first width W1, and the slot 23 of the package substrate 20 has a second width W2 greater than the first width W1. As a result, the slot 23 partially extends beyond the lateral surfaces of the semiconductor chip 30 in a lateral direction D1, which is a direction normal to a stacking direction D2 of the package substrate 20 and the semiconductor chip 30. In other words, in the stack direction D2, some part of the slot 23 of the package substrate 20 is not covered by the semiconductor chip 30. Accordingly, the resin material used to create the molding compound 50 can more easily flow to the lateral side and the upper side of the semiconductor chip 30 to cover the semiconductor chip 30.

As shown in FIGS. 1 and 2, in some embodiments, the slot 23 is partially located outside an orthogonal projection of the semiconductor chip 30 projected onto the package substrate 20. In some embodiments, the slot 23 has two opposite ends, and at least one of the two opposite ends of the slot 23 is located outside an orthogonal projection of the semiconductor chip 30 projected onto the package substrate 20.

As shown in FIGS. 1 and 2, in some embodiments, the slot 23 of the package substrate 20 is filled by the molding compound 50. In some embodiments, the molding compound 50 extends beyond the second surface 22 of the package substrate 20 and covers the region around the slot 23. The molding compound 50 can provide protection for the chip circuit 35. Before performing internal probing on the semiconductor package 10, a portion of the molding compound 50 filling the slot 23 can be removed to expose the chip circuit 35. In some embodiments, the molding compound 50 can be removed by etching.

As shown in FIGS. 1 and 2, in some embodiments, the package substrate 20 has a central portion C1. The package substrate 20 includes a plurality of first conductive pads 25 located on the first surface 21 of the package substrate 20 and connected to the conductive bumps 40. The first conductive pads 25 are arranged around the central portion C1, and the slot 23 is located in the central portion C1. By this arrangement, the slot 23 can be formed on the package substrate 20 without requiring much change to the circuit layout of package substrate 20.

As shown in FIGS. 1 and 2, in some embodiments, the package substrate 20 further includes a plurality of second conductive pads 26 located on the second surface 22 of the package substrate 20 and connected to the external connection terminals 60. The second conductive pads 26 are arranged around the central portion C1 of the package substrate 20, and the slot 23 is located in the central portion C1.

As shown in FIGS. 1 and 2, in some embodiments, the package substrate 20 further includes a plurality of conductive routes 29 electrically connecting the first conductive pads 25 to the second conductive pads 26. The conductive routes 29 are arranged around the central portion C1 of the package substrate 20, and the slot 23 is located in the central portion C1. In some embodiments, the conductive routes 29 may include one or more conductive traces, one or more conductive via structures, or combination thereof.

As shown in FIGS. 1 and 2, in some embodiments, the semiconductor chip 30 has a central portion C2. The bonding pads 31 are arranged around the central portion C2 of the semiconductor chip 30 and are connected to the conductive bumps 40. The chip circuit 35 is located in the central portion C2 of the semiconductor chip 30 to face the slot 23.

In some embodiments, the slot 23 can be located underneath the semiconductor chip 30, but away from the center of the package substrate 20. For example, the slot 23 can be formed between adjacent first conductive pads 25 (or between adjacent second conductive pads 26) and be spaced apart from any conductive route 29. Likewise, the chip circuit 35 can be provided at a location away from the center of the semiconductor chip 30 (e.g., between adjacent bonding pads 31) and faces the slot 23.

Figure 3:
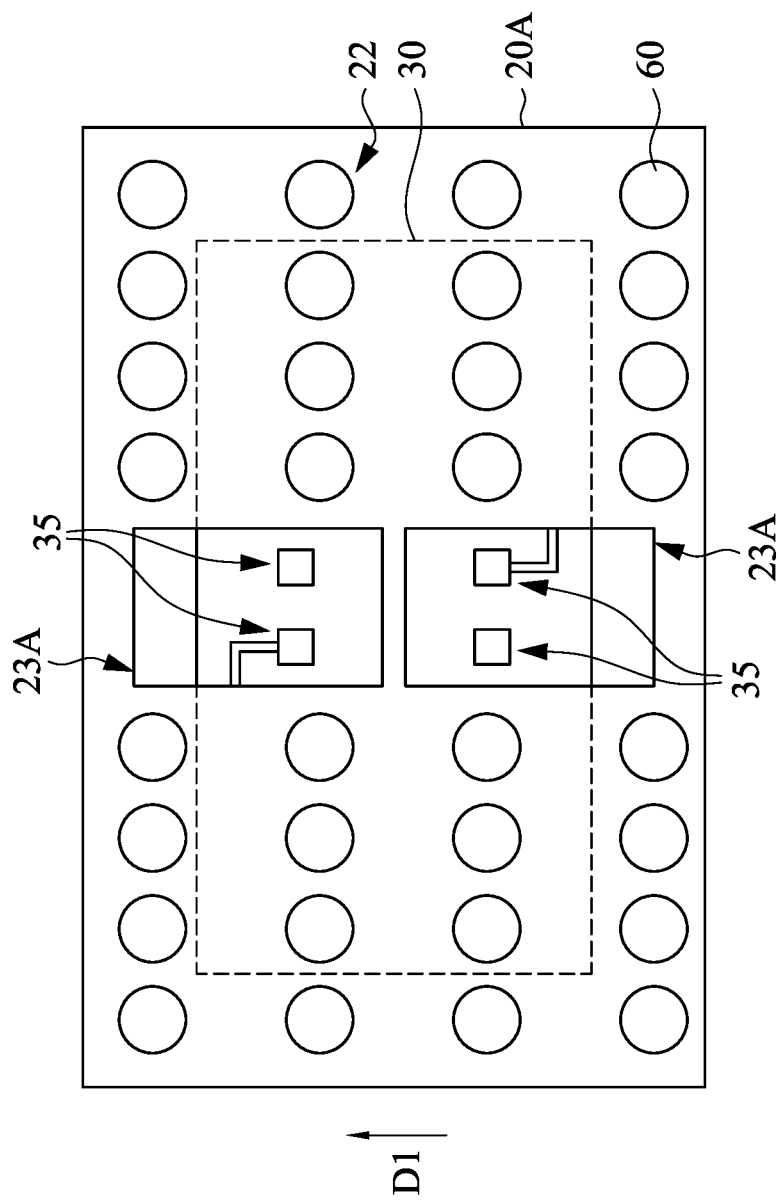
FIG. 3 illustrates a schematic bottom view of a semiconductor package in accordance with another embodiment of the present disclosure.

Reference is made to FIG. 3. FIG. 3 illustrates a schematic bottom view of a semiconductor package 12 in accordance with another embodiment of the present disclosure. The semiconductor package 12 includes a package substrate 20A, a semiconductor chip 30 disposed on the package substrate 20A, a plurality of conductive bumps 40 (not visible in the bottom view) connecting the semiconductor chip 30 to the package substrate 20A, a molding compound 50 (not visible in FIG. 3) encapsulating the semiconductor chip 30 and the conductive bumps 40, and a plurality of external connection terminals 60 attached to a lower surface of the package substrate 20A. The present embodiment differs from the embodiment discussed above in that the package substrate 20A of the semiconductor package 12 has a plurality of slots 23A, and the chip circuit 35 of the semiconductor chip 30 faces the plurality of slots 23A of the package substrate 20A. In some embodiments, orthogonal projections of the plurality of slots 23A projected onto the semiconductor chip 30 at least partially overlap with the chip circuit 35.

In accordance with an embodiment of the present disclosure, a method of manufacturing a semiconductor package (e.g., the semiconductor package 10 or 12) includes: (a) providing a package substrate 20 or 20A, the package substrate 20 or 20A having a first surface 21, a second surface 22 opposite to the first surface 21, and at least one slot 23 or 23A extending from the first surface 21 to the second surface 22; (b) mounting a semiconductor chip 30 on the package substrate 20 or 20A by a flip-chip bonding process, such that a chip circuit 35 of the semiconductor chip 30 faces the slot 23 or 23A (e.g., by providing conductive bumps 40 on the bonding pads 31 of the semiconductor chip 30, and then flipping the semiconductor chip 30 such that the conductive bumps 40 face the package substrate 20 or 20A, and then attaching the conductive bumps 40 to the package substrate 20 or 20A); and (c) encapsulating the semiconductor chip 30 with a molding compound 50 (e.g., by injecting a resin material through the slot 23 or 23A from a lower side of the package substrate 20 or 20A, and subsequently curing the resin material). In some embodiments, the method further includes: attaching a plurality of external connection terminals 60 to the second surface 22 of the package substrate 20 or 20A (e.g., to form a ball grid array).

In sum, in the semiconductor package of the present disclosure, the package substrate is provided with a slot, and the semiconductor chip mounted on the package substrate is provided with a chip circuit that faces the slot. By this arrangement, the chip circuit of the semiconductor chip can be accessed through the slot of the package substrate. The chip circuit may include an inspection circuit, such that probing of the semiconductor chip can be performed through the slot of the package substrate. The chip circuit may include a data signal circuit, and the data signal circuit can be edited or repaired through the slot of the package substrate.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor package, comprising:
    a package substrate having a first surface, a second surface opposite to the first surface, and at least one slot extending from the first surface to the second surface, wherein the at least one slot is completely surrounded by the package substrate;
    a semiconductor chip disposed on the first surface of the package substrate and comprising a chip circuit, the chip circuit facing the at least one slot of the package substrate and is exposed through the at least one slot;
    a plurality of conductive bumps located between the package substrate and the semiconductor chip, wherein the conductive bumps electrically connect the semiconductor chip to the package substrate outside the at least one slot; and
    a molding compound encapsulating the semiconductor chip and the conductive bumps,
    wherein the at least one slot is partially located outside an orthogonal projection of the semiconductor chip projected onto the package substrate.

2. The semiconductor package of claim 1, wherein an orthogonal projection of the at least one slot projected onto the semiconductor chip at least partially overlaps with the chip circuit.

3. The semiconductor package of claim 1, wherein the semiconductor chip has a central portion, the chip circuit is located in the central portion, and the semiconductor chip further comprises a plurality of bonding pads arranged around the central portion and connected to the conductive bumps.

4. The semiconductor package of claim 1, wherein the package substrate has a central portion, the at least one slot is located in the central portion, and the package substrate comprises a plurality of first conductive pads arranged around the central portion and connected to the conductive bumps.

5. The semiconductor package of claim 4, wherein the package substrate further comprises a plurality of second conductive pads and a plurality of conductive routes, wherein the first conductive pads are located on the first surface, the second conductive pads are located on the second surface, the conductive routes electrically connect the first conductive pads to the second conductive pads, and wherein the second conductive pads and the conductive routes are arranged around the central portion.

6. The semiconductor package of claim 1, further comprising a plurality of external connection terminals attached to the second surface of the package substrate which is away from the semiconductor chip, wherein the package substrate has a central portion, the at least one slot is located in the central portion, and the external connection terminals are arranged around the central portion.

7. The semiconductor package of claim 1, wherein the chip circuit comprises an inspection circuit.

8. The semiconductor package of claim 1, wherein the chip circuit comprises a data signal circuit.

9. The semiconductor package of claim 1, wherein the semiconductor chip has a first width, and the at least one slot has a second width greater than the first width.

10. The semiconductor package of claim 1, wherein the at least one slot is filled by the molding compound.

11. A method of manufacturing a semiconductor package, comprising:
    providing a package substrate, the package substrate having a first surface, a second surface opposite to the first surface, and at least one slot extending from the first surface to the second surface, wherein the at least one slot is completely surrounded by the package substrate;
    mounting a semiconductor chip on the first surface of the package substrate by a flip-chip bonding process, such that a chip circuit of the semiconductor chip faces the at least one slot and is exposed through the at least one slot;
    providing a plurality of conductive bumps between the package substrate and the semiconductor chip, wherein the conductive bumps electrically connect the semiconductor chip to the package substrate outside the at least one slot; and
    encapsulating the semiconductor chip with a molding compound,
    wherein the at least one slot is partially located outside an orthogonal projection of the semiconductor chip projected onto the package substrate.

12. The method of claim 11, wherein an orthogonal projection of the at least one slot projected onto the semiconductor chip at least partially overlaps with the chip circuit.

13. The method of claim 11, wherein the chip circuit comprises an inspection circuit.

14. The method of claim 11, wherein the chip circuit comprises a data signal circuit.

* * * * *